US006859090B2

(12) United States Patent
    Liu

(10) Patent No.: US 6,859,090 B2
(45) Date of Patent: Feb. 22, 2005

(54) BURIED FUSE READING DEVICE

(75) Inventor: Peter T. Liu, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/066,028

(22) Filed: Jan. 31, 2002

(65) Prior Publication Data

US 2003/0141921 A1 Jul. 31, 2003

(51) Int. Cl.[7] .................... H01H 37/76; H01H 85/00
(52) U.S. Cl. ........................... 327/525; 327/526
(58) Field of Search .................... 327/525, 526; 365/225.7, 96, 200

(56) References Cited

U.S. PATENT DOCUMENTS

| 5,619,469 | A | * | 4/1997 | Joo ..................... 365/225.7 |
| 5,991,220 | A | | 11/1999 | Freyman et al. ......... 365/225.7 |
| 6,125,069 | A | * | 9/2000 | Aoki ..................... 365/225.7 |
| 6,157,583 | A | * | 12/2000 | Starnes et al. ............ 365/200 |
| 6,240,033 | B1 | * | 5/2001 | Yang et al. ............. 365/225.7 |
| 6,384,664 | B1 | * | 5/2002 | Hellums et al. ............ 327/525 |

* cited by examiner

Primary Examiner—Quan Tra

(57) ABSTRACT

A buried fuse reading device includes at least one buried fuse and at least one sense amplifier sensing a condition of the buried fuse. A validation circuit in the buried fuse reading device detects and indicates when output from the sense amplifier is valid.

22 Claims, 3 Drawing Sheets

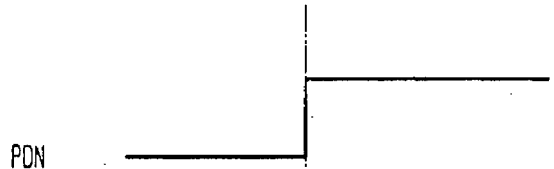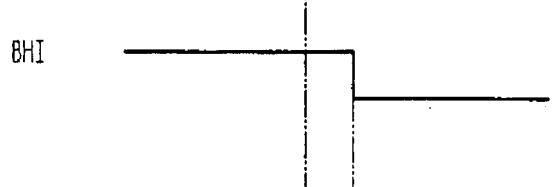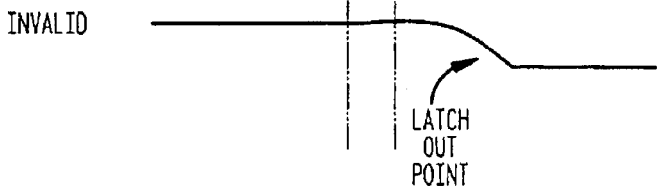

BURIED FUSE READING DEVICE

BACKGROUND OF THE INVENTION

1. Field of the Invention

The present invention is related to semi-conductor devices. In particular, the present invention is related to buried fuse reading circuits.

2. Description of Related Art

In prior art fuse reading circuits, a blown buried (e.g., metal) fuse may be distinguished from an intact fuse by configuring a corresponding sense amplifier to change state when the fuse resistance exceeds a specified value. The fuse resistance may be determined by the sense amplifier as a function of a current, which passes through the sense amplifier and the fuse. Thus a threshold value for the current may be established corresponding to the specified fuse resistance to establish a trip point. The trip point corresponds to the value of fuse resistance, which causes the sense amplifier to change state.

The resistance of an intact fuse is typically on the order of a single digit and is well controlled. The resistance of a blown fuse, however, may depend on variables such as moisture and passivation properties and are thus more difficult to control or predict. A low trip point provides better margin to resist the effects of such variables at the expense of much higher currents. In fact, the current required by the sense amplifier is inversely proportional to the square of the trip point. To conserve energy, the sense amplifiers are turned off after the fuses have been read and their values latched. In battery powered devices or in large arrays of buried fuses, the total energy consumed by the fuse read process, which may be measured as I*V*t, becomes an important system consideration.

Variations in factors such as fabrication processing, ambient and internal temperatures, and power supply conspire to spread the value of currents and the settling time of the sense amplifier over a wide range. Traditional designs call for a timer to power up the sense amplifiers for a period corresponding to the maximum settling time required by the worst case values. Since the timer period is fixed and corresponds to worst case values, the energy consumption under best-case settling can be twice as much as necessary. Furthermore, a relatively accurate clocking mechanism must be incorporated into the device design having the undesirable effect of raising overall device costs.

Previous attempts to solve problems and disadvantages associated with prior art designs include: 1) using a clock and counter to measure out the time period required to read the fuses for worst-case conditions, which period is typically much longer than that needed for best-case and nominal conditions leading to extra energy consumed; 2) using lower currents but larger sense amplifier transistors; and 3) moving the trip point higher. Problems arise, however, in prior art solutions in that, for example, with regard to 1), a relatively accurate clock is needed and gives rise to additional energy to account for clock frequency variations and the need for additional silicon area; 2) the sense amplifier gain for larger transistors is inversely proportional to the square of the trip point and additional silicon area is needed; and 3) higher trip points lead to trade offs with regard to device robustness.

SUMMARY OF THE INVENTION

In the buried fuse reading circuit of the present invention, a validation circuit tracks the operation of the sense amplifier, which is sensing the condition of a buried fuse. The validation circuit in tracking the operation of the sense amplifier detects when the sense amplifier has sufficiently settled so that the output of the sense amplifier, which indicates the condition of the fuse, can be used.

In a preferred embodiment, a bias generator circuit controls the operation of the sense amplifier and the validation circuit. In a powered down state, the bias generator generates first and second bias voltages such that no current flows in the sense amplifier and the validation circuit. As a result no power is consumed in the powered down state.

In the powered up state, the bias generator generates the first and second bias voltages such that the sense amplifier and the validation circuit become operational. Once operational, the sense amplifier generates an output voltage indicating the state of the fuse being sensed. However, the time for the sense amplifier to complete the sensing operation and settle upon an output voltage value varies depending upon numerous factors as discussed above in the background of the invention section. Furthermore, because one of the output voltage states of the sense amplifier is the same as the output voltage of the sense amplifier in the powered down state, the point when the sense amplifier has settled on an output voltage can not necessarily be detected from the output voltage of the sense amplifier. However, the validation circuit tracks or mimics the operation of the sense amplifier, but is structured such that the output voltage produced thereby transitions as the sense amplifier is settling on an output voltage, regardless of the state of the fuse. As such, the validation circuit detects and indicates when the sense amplifier has sufficiently settled on an output voltage indicating the state of the fuse.

In this manner, the output voltage of the sense amplifier is latched just prior to the sense amplifier reaching a steady-state; thus, reducing power consumption. Additionally, the trip point for latching the output voltage of the sense amplifier is dynamically adjusted, instead of operating the sense amplifier based on worse case conditions. Consequently, the buried fuse reading circuit according to the present invention achieves significant reductions in energy consumption.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein:

FIGS. 2A–2G illustrate signals input and output from elements in the buried fuse reading circuit.

DETAILED DESCRIPTION OF THE PREFERRED EMBODIMENTS

Figure 1A:
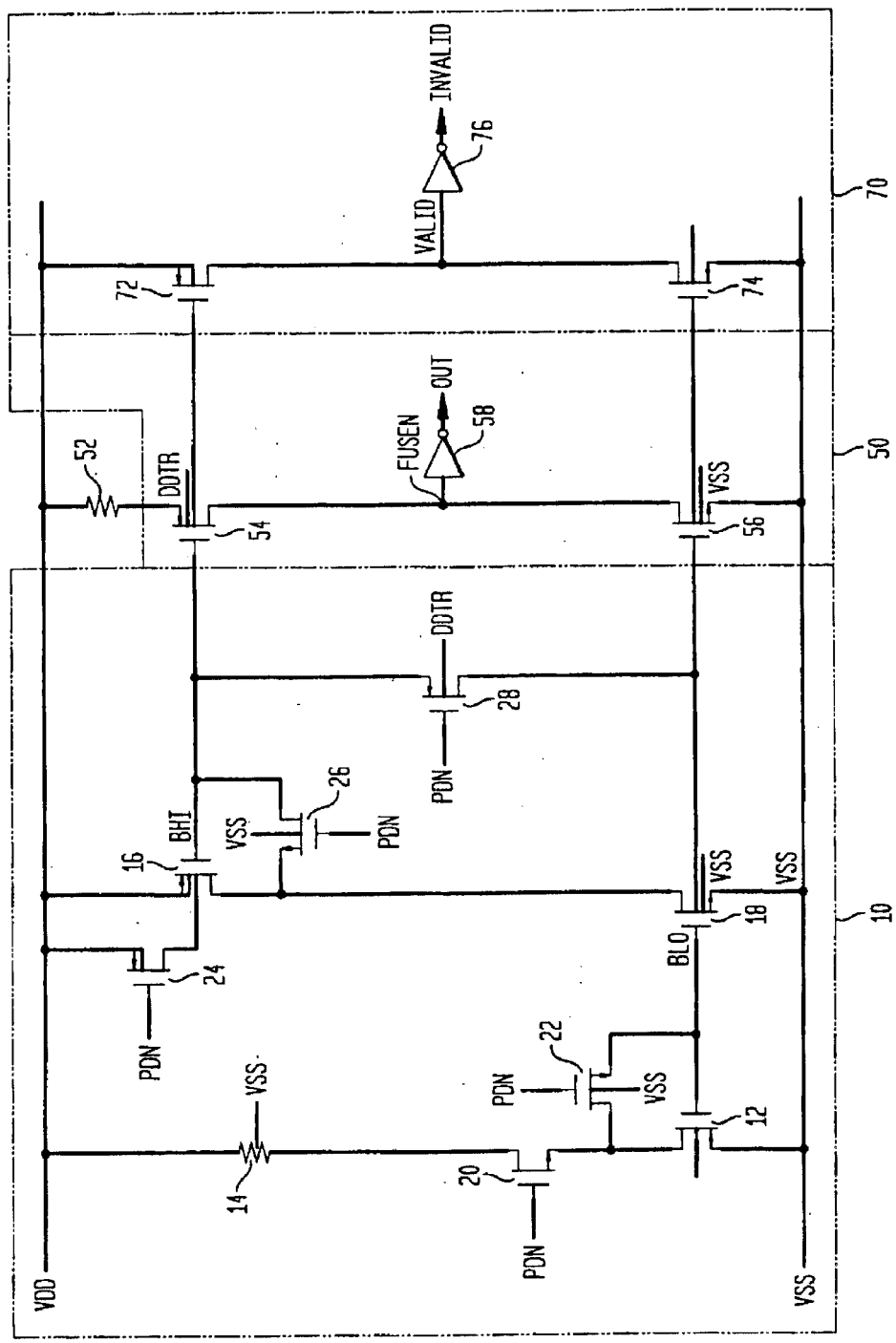
FIGS. 1A and 1B illustrates a buried fuse reading device according to an embodiment of the present invention.

FIG. 1A illustrates a buried fuse reading device according to an embodiment of the present invention. As shown, the buried fuse reading device includes a bias generator 10 supplying first and second bias voltages on first and second bias voltage lines BHI and BLO to a sense amplifier 50 and a validation circuit 70.

The bias generator 10 includes a first NMOS transistor connected in series with a resistor 14 between a high voltage line VDD and a low voltage line VSS (e.g., ground). The bias generator 10 further includes a first PMOS transistor 16 connected in series with a second NMOS transistor 18 between the high and low voltage lines VDD and VSS. As shown, the gates of the first and second NMOS transistor 12 and 18 are connected, and the gates of the first PMOS transistor 16 and the second NMOS transistor 18 are connected to the first and second bias voltage lines BHI and BLO, respectively.

The bias generator 10 also includes a power down circuit formed by first—fifth power control transistors 20, 22, 24, 26 and 28. The first, second and fourth power control transistors 20, 22 and 26 are NMOS transistors, and the third and fifth power control transistors 24 and 28 are PMOS transistors. The first power control transistor 20 is connected between the resistor 14 and the first NMOS transistor 12. The second power control transistor 22 is connected between the source and gate of the first NMOS transistor 12. The third power control transistor 24 is connected between the high voltage line VDD and the gate of the first PMOS transistor 16. The fourth power control transistor 26 is connected between the source and gate of the first PMOS transistor 16. The fifth power control transistor 28 is connected between the gates of the first PMOS transistor 16 and the second NMOS transistor 18. The gates of the first—fifth power controls transistors 20, 22, 24, 26 and 28 receive a power control signal PDN.

Figure 1B:
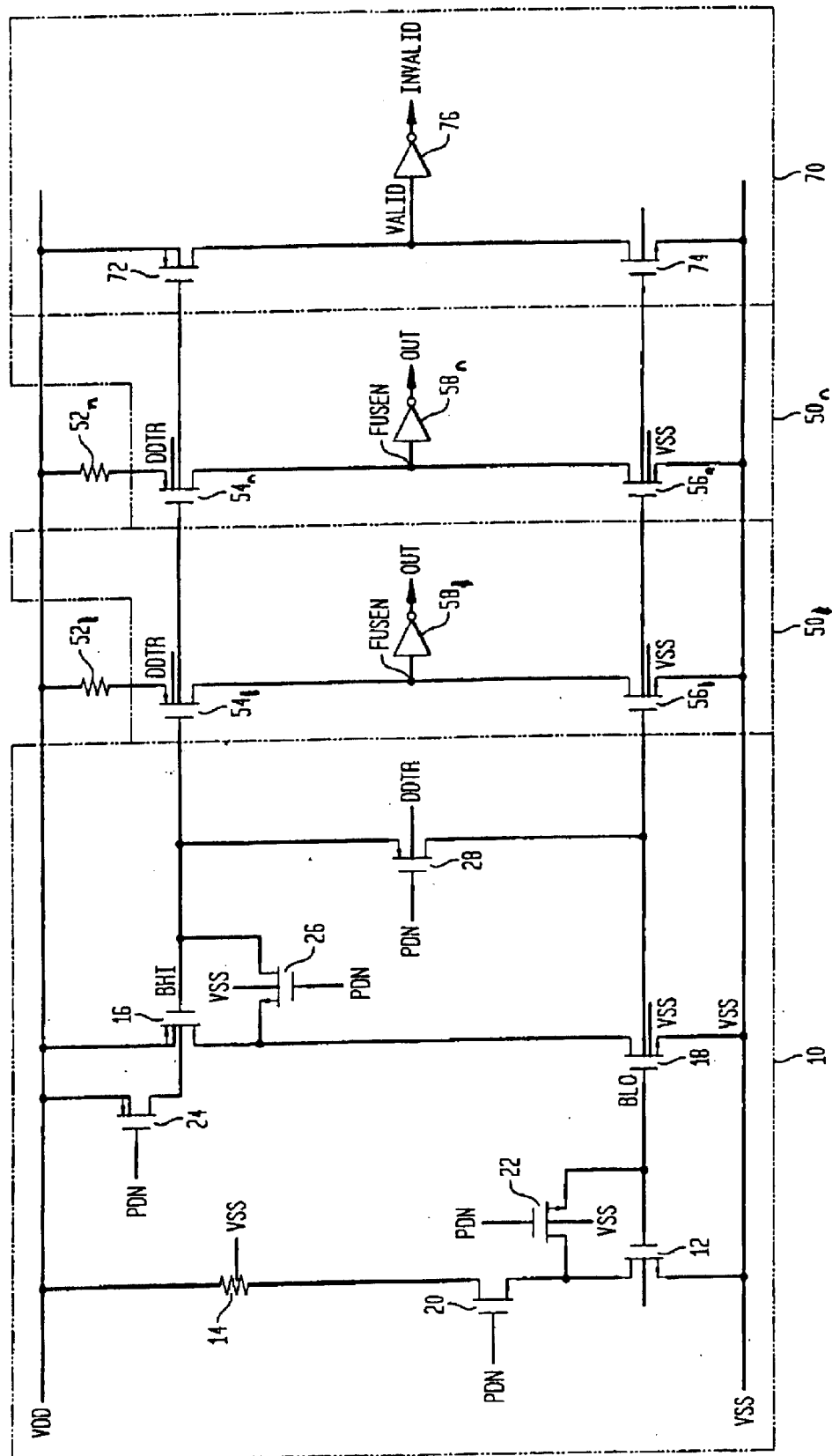

The sense amplifier 50 includes a second PMOS transistor 54 and a third NMOS transistor 56 connected in series with a fuse 52 between the high voltage line VDD and the low voltage line VSS. In a preferred embodiment, the fuse 52 is a buried metal fuse. The sources of the second PMOS transistor 54 and the third NMOS transistor 56 are connected at a node FUSEN to an inverter 58. The output of the inverter 58 serving as the output OUT of the buried fuse reading circuit. While only one fuse and sense amplifier has been illustrated in FIG. 1A for the sake of clarity, it will be understood by those skilled in the art that numerous fuses and sense amplifiers (e.g., 15 other fuses and sense amplifiers) could be connected in parallel with the illustrated sense amplifier 50 and fuse 52 as shown in FIG. 1B. FIG. 1B is the same as FIG. 1A except that the sense amplifier 50 and fuse 52 are shown as being parallel. The number of parallel instances of sense amplifier 50 and fuse 52 may be from 1 to n; where n is the total number of parallel instances. As further shown in FIG. 1A, the gates of the second PMOS transistor 54 and the third NMOS transistor 56 are connected to the first and second bias voltage lines BHI and BLO, respectively.

Continuing to refer to FIG. 1A, the validation circuit 70 includes a third PMOS transistor 72 and a fourth NMOS transistor 74 connected in series between the high voltage line VDD and the low voltage line VSS. The third PMOS transistor 72 and the fourth NMOS transistor 74 are weaker (i.e., have a smaller drive capability) than the second PMOS transistor 54 and the third NMOS transistor 56, respectively. An inverter 76 is connected to the sources of the third PMOS transistor 72 and the fourth NMOS transistor 74 at a node VALID, and the output of the inverter 76 produces the INVALID output of the validation circuit 70.

Next the operation of the buried fuse reading circuit illustrated in FIG. 1A will be described with reference to FIG. 1A and FIGS. 2A–2G. FIGS. 2A–2G illustrate signals input and output from elements in the buried fuse reading circuit. When the buried fuse reading circuit is in a powered down state, the control signal PDN is low as shown in FIG. 2A. In this state, the first, second and fourth power control transistors 20, 22 and 26 are off and do not conduct. However, the third and fifth power control transistors 24 and 28 are turned on and do conduct. As such, the first bias voltage line BHI is pre-charged up to the high voltage on the high voltage line VDD via the third power control transistor 24 as shown in FIG. 2B, and the second bias voltage line BLO is also pre-charged up to the high voltage on the high voltage line VDD via the third and fifth power control transistors 24 and 28 as shown in FIG. 2C.

Because the first bias voltage line BHI is charged to the high voltage on the high voltage line VDD, the second and third PMOS transistors 54 and 72 are turned off. Because the second bias voltage line BLO is charged to the high voltage on the high voltage line VDD, the third and fourth NMOS transistors 56 and 74 are turned on, but no current flows because the second and third PMOS transistors 54 and 72 are turned off.

In the powered down state, the FUSEN and VALID nodes are at a low voltage as shown in FIGS. 2D and 2E, respectively, and thus, the OUT and INVALID signals are at a higher voltage as shown in FIGS. 2F and 2G.

When the power control signal PDN transitions to a high voltage, both the first and second bias voltage lines BHI and BLO discharge toward their operating points closer to the low voltage on the low voltage line VSS. Even though the first and second control transistors 20 and 22 turn on, the first NMOS transistor 12 is also on, and pulls down the voltage the node where the first and second control transistors 20 and 22 connect. As a result, via the second control transistor 22, the second bias voltage line BLO is pulled down toward a lower voltage as shown in FIG. 2C. It will be appreciated, however, that while the voltages on the first and second bias voltage lines BHI and BLO are closer to the low voltage on the low voltage line VSS, they are not at the low voltage on the low voltage line VSS. The voltages on the first and second bias voltage lines BHI and BLO set operating points for the NMOS and PMOS A transistors having their gates connected thereto. As such, the resistor 14 and first NMOS transistor 12 generate a low-side current that is mirrored by the NMOS transistors having their gates connected to the second bias voltage line BLO. From the low-current side, the second NMOS transistor 18 and the first PMOS transistor 16 derive a high-side current that is mirror by the PMOS transistors having their gates connected to the first bias voltage line BHI.

The third and fifth power control transistors 24 and 28 are off when the power control signal PDN is high, but the fourth power control transistor 26 turns on. The fourth power control transistor 26 in conjunction with the first PMOS transistor 16 and second NMOS transistor 18 serve to pull down the first bias voltage line BHI toward a lower voltage as shown in FIG. 2B. As shown by a comparison of FIGS. 2B and 2C, the bias generator 10 is structured such that the discharge of the first bias voltage line BHI is delayed with respect to the discharge of the second bias voltage line BLO because the voltage on the fist bias voltage line BHI is derived from the voltage on the second bias voltage line BLO.

The sense amplifier 50 function by having the third NMOS transistor 56 sink less current than the second PMOS transistor 54 can source. When the fuse 52 is blown, the blown fuse 52 greatly reduces current flow through the second PMOS transistor 54 and the third NMOS transistor 56 can therefore sink the current from the second PMOS transistor 54. As a result, the FUSEN node remains at a low voltage as shown in FIG. 2D, and the OUT voltage remains at a higher voltage as shown in FIG. 2F.

An intact fuse 52 allows the second PMOS transistor 54 to source more current than the third NMOS transistor 56 can sink. As a result, the FUSEN node charges up toward a higher voltage as shown in FIG. 2D, and the OUT voltage falls to a lower voltage as shown in FIG. 2F.

Because no fuse exists in the validation circuit, the third PMOS transistor 72 will source more current than the fourth NMOS transistor 74 can sink, regardless of whether the fuse 52 is blown or intact. As such, when the buried fuse reading circuit is powered up, the VALID node charges to a higher voltage as shown in FIG. 2E and the INVALID voltage discharges to a lower voltage as shown in FIG. 2G. The falling edge of the INVALID voltage is used as the trip point for latching the value of the OUT voltage. Thereafter, the buried fuse reading circuit is powered down.

As one skilled in the art will appreciate, by precharging the first and second bias voltage lines BHI and BLO high and delaying the discharge of the first bias voltage line BHI relative to the second bias voltage line BLO, the trip point is guaranteed to start at a low value and creep towards the steady-state value, resulting in a transient effective trip point lower than anticipated.

The validation circuit 70 tracks the operation of the sense amplifier 50, and is analogous in operation to the sense amplifier 50 sensing an intact fuse. Accordingly, when the INVALID voltage transitions to a lower voltage, this indicates that the sensing amplifier 50 has settled sufficiently that the OUT voltage reliably indicates the state of the fuse 52. In this manner, the OUT voltage is latched just prior to the sense amplifier 50 reaching a steady-state; thus, reducing power consumption. Additionally, it will be understood that the trip point for latching the OUT voltage is dynamically adjusted based on operating conditions and other factors instead of operating the sense amplifier for the worse case condition. Consequently, the buried fuse reading circuit according to the present invention achieves significant reductions in energy consumption.

The invention being thus described, it will be obvious that the same may be varied in many ways. Such variations are not to be regarded as a departure from the spirit and scope of the invention, and all such modifications are intended to be included within the scope of the following claims.

I claim:

1. A buried fuse reading device, comprising:
   a buried fuse;
   a sense amplifier including a first PMOS transistor and a first NMOS transistor connected in series with the buried fuse, a gate of the first PMOS transistor receiving a first voltage and a gate of the first NMOS transistor receiving a second voltage; and
   a validation circuit including a second PMOS transistor and a second NMOS transistor connected in series, a gate of a second PMOS transistor receiving the first voltage and a gate of a second NMOS transistor receiving the second voltage, the second PMOS transistor and second NMOS transistor being weaker than the first PMOS transistor and first NMOS transistor, respectively.

2. A buried fuse reading device, comprising:
   at least one buried fuse;
   at least one sense amplifier sensing a condition of the buried fuse; and
   a validation circuit mimicking the sense amplifier regardless of the state of the at least one buried fuse, and indicating when the sense amplifier output is valid, wherein the validation circuit is the same as the at least one sense amplifier except that the validation circuit includes weaker components.

3. The device of claim 2, wherein the validation circuit indicates when the sense amplifier has sufficiently settled on a sensed condition of the buried fuse.

4. The device of claim 3, further comprising:
   a power control circuit for powering the buried fuse reading device up and down; and wherein
   the validation circuit indicates when the sense amplifier has sufficiently settled on a sensed condition once the power control circuit begins powering up the buried fuse reading device.

5. The device of claim 4, further comprising:
   a bias generating circuit for generating first and second voltages; and wherein the sense amplifier operates based on the first and second voltages.

6. The device of claim 5, wherein the validation circuit operates based on the first and second voltages.

7. The device of claim 6, wherein
   the sense amplifier includes a first PMOS transistor and a first NMOS transistor connected in series with the buried fuse, a gate of the first PMOS transistor receiving the first voltage and a gate of the first NMOS transistor receiving the second voltage; and
   the validation circuit includes a second PMOS transistor and a second NMOS transistor connected in series, a gate of the second PMOS transistor receiving the first voltage and a gate of the second NMOS transistor receiving the second voltage, the second PMOS and NMOS transistor being weaker than the first PMOS and NMOS transistor, respectively.

8. The device of claim 2, comprising:
   a plurality of buried fuses; and
   a sense amplifier associated with each of the buried fuses.

9. The device of claim 2, wherein an output from the validation circuit identifies a validation point that is dynamically adjusted based on the sense amplifier operating conditions, the validation point being a point in time when the sense amplifier output is considered valid.

10. The device of claim 9, further comprising:
    a power control circuit for powering the buried fuse reading device up and down; and wherein
    the validation point is the point in time when output from the sense amplifier is considered valid once the power control circuit begins powering up the buried fuse reading device.

11. The device of claim 10, further comprising:
    a bias generating circuit for generating first and second voltages; and wherein
    the sense amplifier operates based on the first and second voltages.

12. The device of claim 11, wherein the validation circuit operates based on the first and second voltages.

13. The device of claim 12, wherein
    the sense amplifier includes a first PMOS transistor and a first NMOS transistor connected in series with the buried metal fuse, a gate of the first PMOS transistor receiving the first voltage and a gate of the first NMOS transistor receiving the second voltage; and
    the validation circuit includes a second PMOS transistor and a second NMOS transistor connected in series, a gate of the second PMOS transistor receiving the first voltage and a gate of the second NMOS transistor receiving the second voltage, the second PMOS and NMOS transistor being weaker than the first PMOS and NMOS transistor, respectively.

14. The device of claim 9, comprising:
a plurality of buried fuses; and
a sense amplifier associated with each of the buried fuses.

15. The device of claim 2, comprising:
a power control circuit for powering the buried fuse reading device up and down.

16. The device of claim 15, wherein the sense amplifier and the validation circuit draw substantially no current when the power control circuit has the buried fuse reading device powered down.

17. The device of claim 2, wherein the validation circuit is connected in parallel with the at least one sense amplifier and the at least one buried fuse.

18. A buried fuse reading device, comprising:
a bias generating circuit adapted to generate first and second bias voltages;
at least one buried fuse;
at least one sense amplifier adapted to generate, based on the first and second bias voltages, an output indicating a condition of the buried fuse; and
a validation circuit adapted to track the operation of the sense amplifier to generate, based on the first and second bias voltages, an output indicating when the output of the sense amplifier is valid, wherein:
when the device is powered up, the bias generating circuit causes the first and second bias voltages to transition to different levels at two different times, which in turn causes the output of the validation circuit to transition to a different level; and
the transition of the output of the validation circuit to the different level indicates when the output of the sense amplifier is valid.

19. The device of claim 18, wherein each of the sense amplifier and the validation circuit are implemented using one or more transistors, wherein the one or more transistors of the validation circuit are weaker than the one or more transistors of the sense amplifier.

20. The device of claim 18, wherein the device comprises:
a plurality of buried fuses; and
a sense amplifier associated with each of the buried fuses.

21. The device of claim 18, wherein the timing of the transition of the output of the validation circuit is dynamically adjusted based on the operating conditions of the device.

22. The device of claim 18, wherein the sense amplifier and the validation circuit draw substantially no current when the device is powered down.

* * * * *